(12) United States Patent
Kim

(10) Patent No.: US 6,462,617 B1
(45) Date of Patent: Oct. 8, 2002

(54) METHOD AND APPARATUS FOR CALCULATING THE PREDISTORTION FUNCTION FROM A POWER AMPLIFIER MODEL

(75) Inventor: Jaehyeong Kim, Pine Brook, NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/878,037

(22) Filed: Jun. 8, 2001

(51) Int. Cl.[7] .......................... G01R 19/00; H03F 1/26; H04K 1/02
(52) U.S. Cl. ............................. 330/2; 330/149; 375/297
(58) Field of Search ...................... 330/2, 149; 375/297

(56) References Cited

U.S. PATENT DOCUMENTS

| | | | |
|---|---|---|---|
| 6,075,411 A | * | 6/2000 | Briffa et al. ................. 330/149 |
| 6,236,837 B1 | * | 5/2001 | Midya ........................ 330/149 |
| 6,288,610 B1 | * | 9/2001 | Miyashita ................... 330/149 |

* cited by examiner

*Primary Examiner*—Robert Pascal
*Assistant Examiner*—Patricia Nguyen
(74) *Attorney, Agent, or Firm*—Harness, Dickey & Pierce, P.C.

(57) ABSTRACT

Disclosed is an apparatus and method for calculating a predistortion function from power amplifier characteristics. A predistortion module generates a predistorted signal in response to an input signal and predistortion coefficients received from a predistortion function calculating module. The predistortion function calculating module generates the predistortion coefficients in response to the given amplifier characteristics. Polynomial fitting is used to obtain the predistortion coefficients. In particular, the input signal is represented by single or multiple sectors having multiple points and then predistortion coefficients are calculated for each sector.

7 Claims, 2 Drawing Sheets

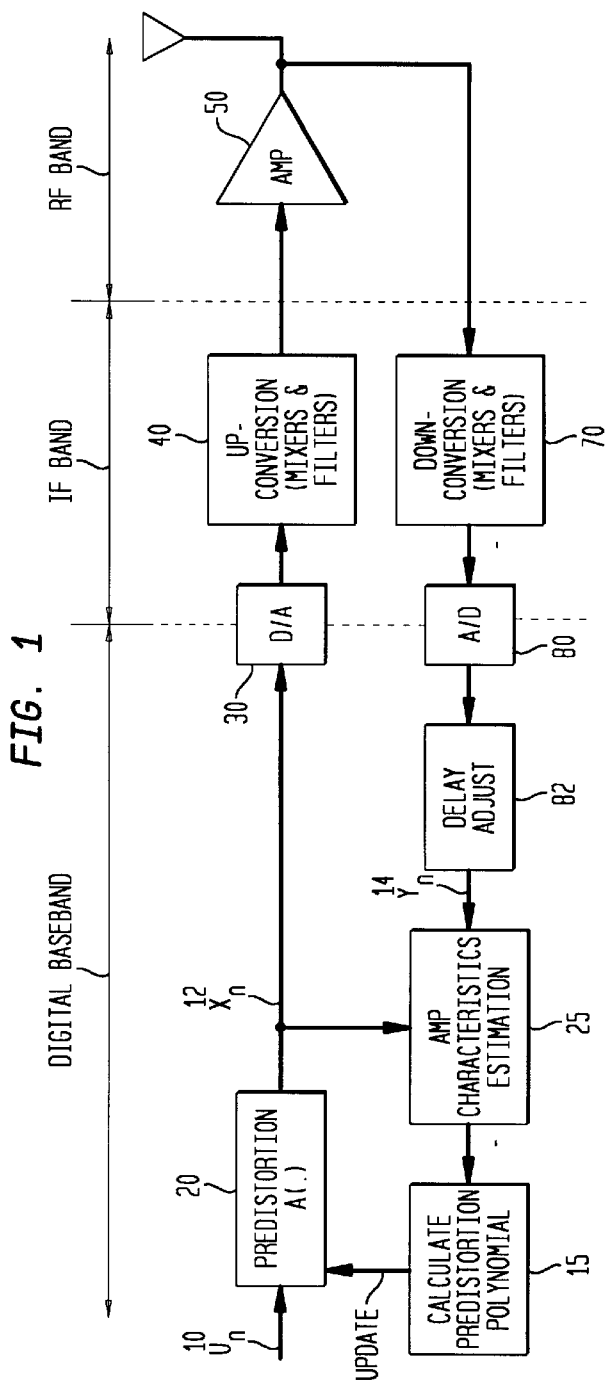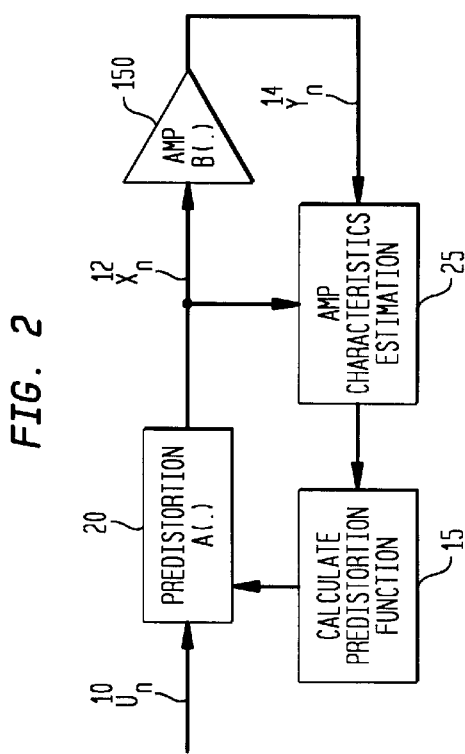

METHOD AND APPARATUS FOR CALCULATING THE PREDISTORTION FUNCTION FROM A POWER AMPLIFIER MODEL

BACKGROUND OF THE INVENTION

In the field of radio communication systems, it is a well-known problem that the power amplifiers present in transmission equipment operate in a non-linear fashion when the power amplifiers are operated near their peak output. As a result, the power amplifier introduces significant signal distortion that can appear in various forms. For example, if more than one signal is input into the power amplifier or power amplification stage, its non-linear characteristics can cause an undesirable multiplicative interaction of the signals being amplified, and the power amplifier's output can contain intermodulation products. These intermodulation products cause interference and crosstalk over the power amplifier's operational frequency range.

In power amplifier design, there is a trade off between distortion performance and efficiency. Linear amplifiers that operate under "Class A" conditions create little distortion but are inefficient, whereas nonlinear amplifiers operated under "Class C" conditions are reasonably efficient but introduce significant distortions. While both efficiency and distortion are important considerations in amplifier design, efficiency becomes increasingly important at high power levels. Because of their efficiency, nonlinear amplifiers are largely preferred, leaving the user with the problem of distortion.

In order to employ nonlinear power amplifiers, techniques have been used to improve linearity and thereby reduce the effects of interference and crosstalk. Linearity can be achieved by application of various linearization techniques that reduce the distortion caused by nonlinear amplification. Conventional amplifier linearization techniques can be broadly categorized as feedback, feedforward, or predistortion.

The last mentioned technique, predistortion, intentionally distorts the signal before the power amplifier so that the non-linearity of the power amplifier can be compensated. According to this technique, linearization is achieved by distorting an input signal according to a predistortion function in a manner that is inverse to the amplifier characteristic function. The predistortion technique can be applied at radio frequency (RF), intermediate frequency (IF), or at baseband.

In the baseband domain, the input signal information is at a much lower frequency, allowing digital methods to be employed. The predistortion function is applied to the input signal with the resulting predistorted signal being upconverted to IF and then finally to the RF carrier frequency. It is also possible to apply adaptive predistortion techniques where feedback from the output of the amplifier is used to update and correct the predistortion function.

The form of the predistortion function is dependent upon the model used to characterize the output of the amplifier. Predistortion functions in the baseband domain are typically implemented as a table of gain and phase weighting values within a digital signal processor. A Cartesian feedback method employs a quadrature representation of the signal being amplified. The incoming quadrature signals I and Q are compared to the feedback quadrature signals. Thus, there are two sets of coefficients, one for each quadrature channel, that are being updated to model the predistortion characteristics. In this manner, gain and phase non-linearities within the amplifier can be compensated. Performance is dependent on the size of the look up table and the number of bits used to represent the signal. Better performance and more adaptivity is achieved with larger look up tables and more bits albeit at the expense of longer processing times.

Predistortion functions are also modeled as polynomials. Here, the complex polynomial must be able to characterize the inverse of the amplifier, which may not analytically exist and which must then be approximated. In order to accurately estimate the inverse, the polynomial requires high order terms, with associated quantization errors and a less accurate polynomial fit.

Accordingly, there is a need for a power amplifier predistortion system that can quickly and efficiently obtain an optimum predistortion function for non-linear amplifiers.

SUMMARY OF THE INVENTION

Disclosed is an apparatus and method for calculating the predistortion function from a power amplifier. A predistortion module generates a predistorted signal in response to an input signal and predistortion coefficients. The predistortion function calculating module generates the predistortion coefficients in response to given amplifier characteristics. Polynomial fitting is used to obtain the predistortion coefficients. For example, rather than analytically calculating the inverse to an amplifier characteristic curve, a number of points along the amplifier characteristic curve are used to determine a predistortion function having a corresponding order. In certain embodiments, the x- and y-axis terms of the amplifier characteristics curve are switched to produce points along a predistortion curve. The predistortion function calculating module calculates a polynomial function that connects the points. Thus, the predistortion function can be more easily calculated.

In exemplary embodiments of the present invention, the predistorted signal is represented by single or multiple sectors having multiple points and then predistortion coefficients are calculated for each sector. Importantly, employing multiple sectors can improve modeling effectiveness by decreasing the number of higher order terms needed to find the optimum coefficients for the predistortion function. Execution rates are increased by eliminating higher order terms, thereby reducing the need for more extensive hardware. Thus, the present invention provides a flexible method of implementation that provides improvements in speed, accuracy, and cost.

By improving the ability to model the power amplifier predistortion function, power amplifiers can be operated in the nonlinear region near saturation, yet suppress undesirable intermodulation products. Resort to a larger amplifier, to keep operation within the linear region, is avoided. Power amplifier sizes are kept small with associated cost savings, particularly important in the field of wireless communications.

The above factors make the present invention essential for effective power amplifier predistortion.

BRIEF DESCRIPTION OF THE FIGURES

For a better understanding of the present invention, reference may be had to the following description of exemplary embodiments thereof, considered in conjunction with the accompanying drawings, in which:

FIG. 1 is a block diagram providing an overview of an exemplary system employing adaptive power amplifier predistortion;

FIG. 2 is a block diagram of the simplified baseband model for power amplifier predistortion;

DETAILED DESCRIPTION OF THE DRAWINGS

Figure 3:
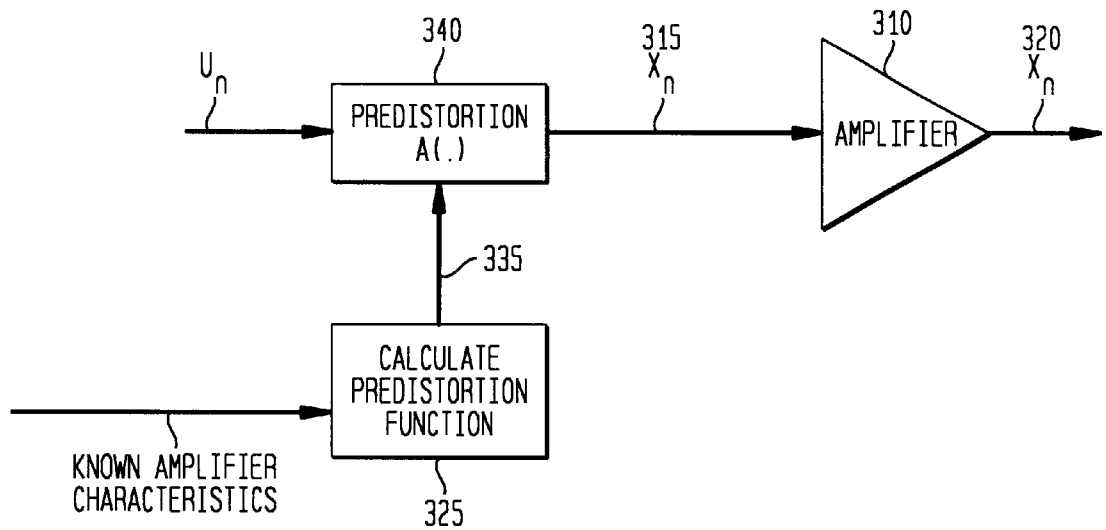
FIG. 3 is a block diagram of a power amplifier employing a predistortion linearization technique in accordance with the principles of the present invention.

The following description is presented to enable a person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and the scope of the invention. Thus, the present invention is not intended to be limited to the embodiments disclosed, but is to be accorded the widest scope consistent with the principles and features disclosed herein.

The specification initially discusses the general concept and principles of adaptive digital predistortion in view of the novel device for employing predistortion techniques. Exemplary embodiments of the present invention are then described.

Overview of Adaptive Power Amplifier Predistortion

The principal benefit of the present invention is the ability to more efficiently calculate the predistortion function from a power amplifier model in order to improve the ability to employ adaptive digital predistortion (ADPD). The structure of an exemplary ADPD system is seen in FIG. 1. An initial baseband digital signal 10 is identified as $u_n$, where n is the time index. The initial baseband digital signal 10 is fed into a predistortion system 20 that is described as a function A(.). The output of the predistortion system 20 is the baseband digital input signal 12 to the power amplifier 50 and is defined as $x_n$. The baseband digital input signal 12 is processed by a digital to analog (D/A) converter 30 with the resulting baseband analog signal being processed by an up-conversion means 40 that is comprised of mixers and filters and operates in the intermediate frequency (IF) range. The up-conversion means 40 outputs a signal in the radio frequency (RF) range and feeds the signal to the power amplifier 50. While there are many methods for ADPD, the approach with the exemplary invention can be divided into two steps. First, the characteristics of the power amplifier 50 are estimated. Then, the predistortion function based on the power amplifier's 50 characteristics is obtained. For proper characterization of the power amplifier 50, the time domain inputs and outputs of the power amplifier 50 need to be compared. Thus, the output of the power amplifier 50 is tapped and fed back to a down-conversion means 70. Like the up-conversion means 40, the down-conversion means 70 requires mixers and filters in the IF range. The output of the down-conversion means 70 is fed into an analog to digital (A/D) converter 80. The output of the A/D converter 80 is input into a means for delay adjustment 82 with its output representing the baseband digital output signal 14 identified as $y_n$. The baseband digital output signal 14 and the baseband digital input signal 12 are input to the polynomial module 25 in order to determine the coefficients that characterize the power amplifier 50. The output of the polynomial module 25 is coupled to the predistortion polynomial module 15 that determines the predistortion coefficients that are fed into the predistortion module 20.

As implemented in FIG. 1, the baseband digital input signal 12 to the power amplifier 50 as well as the baseband digital output signal 14 of the power amplifier 50 are easily accessible. However, the up-conversion means 40 and the down-conversion means 70 distort the signals. Mixers are nonlinear devices and will add non-linear distortions. Furthermore, the phase responses of analog filters are not linear, thereby causing different time delays for different frequency components. Generally, these distortions can be considered negligible or can be corrected by using linear filters, and considered to be part of the baseband model for the power amplifier.

By neglecting the effect of up-conversion and down-conversion process, the whole predistortion process can be considered in the baseband domain. In FIG. 2, an exemplary baseband model for predistortion processing is illustrated. The power amplifier 150 is defined as a baseband function B(.) with complex inputs and complex outputs.

Calculation of Predistortion Function

FIG. 3 illustrates a block diagram 300 of a power amplifier 310 employing a predistortion linearization technique in accordance with the principles of the present invention.

In FIG. 3, the power amplifier 310 comprises an input terminal 315 and an output terminal 320. The power amplifier 310 can be any suitable commercially available power amplifier. An output 335 of the predistortion function calculating module 325 is coupled to a predistortion module 340. The predistortion module 340 can receive an input signal, $u_n$. An output of the predistortion module 340 is coupled to input terminal 315 of the power amplifier 310 to complete the predistortion linearization implementation. The predistortion module and predistortion function calculating module may both be implemented in hardware, or in other forms such as software or firmware.

In general, predistortion module 340 performs the function of combining the input signal $u_n$ with the distortion compensating values received from predistortion function calculating module 325 to produce a predistorted signal $x_n$, which is then provided to the power amplifier 310. The power amplifier 310 amplifies the predistorted input signal $x_n$, applying its own distortion characteristics, and the resultant output signal $y_n$ from the power amplifier 310 is an amplified signal with substantially all distortion removed.

The functionality of predistortion function calculating module 325 and predistortion module 340 are now discussed in more detail.

If it is assumed that power amplifier is operating in the radio frequency (RF) domain, then the baseband model of the power amplifier as shown in FIG. 1, must be considered in complex numbers. Let x and y be the complex input and output of the power amplifier 310, respectively. The relationship can then be modeled as:

$$y = B(x) \qquad (1)$$
$$= b_1 x + b_2 |x| x + b_3 |x|^2 x + \ldots + b_p |x|^{p-1} x$$

where p is the order of the polynomial, $b_x = b_{kr} + jb_{ki}$, k is a member of the set $\{1, 2, \ldots, p\}$.

Letting u and x represent the complex input and output of the predistortion module 340, the predistortion function can be modeled as:

$$x = A(u) \qquad (2)$$
$$= a_1 u + a_2 |u| u + a_3 |u|^2 u + \ldots + a_q |u|^{q-1} u$$

where q is the order of the polynomial, $a_k = a_{kr} + ja_{ki}$, k is a member of the set $\{1, 2, \ldots, q\}$, and a is the size q vector of complex polynomial coefficients defined as $[a_1, a_2,$ $a_3, \ldots, a_q$]. The goal of the predistortion linearization technique is to obtain the best a that makes the relations between u and y as linear as possible. Ideally, the relation is as follows:

$$y = B(x) = B(A(u)) = u \quad (3)$$

Thus, function $A(.)$ needs to be the inverse function of $B(.)$. However, it is not possible to obtain an ideal inverse function $A(.)$, because $B(.)$ is not a one-to-one function near the saturation point of the power amplifier 310.

Polynomial fitting is used for obtaining the inverse function and is now discussed. Let $P_{peak}$ be the peak input amplitude (signal amplitude is greater than peak value with the probability of $10^{-4}$), and $R = \gamma P_{peak}$, where $0 < \gamma \leq 1$.

First, the input range R is uniformly divided at q points as follows:

$$v_n = n(R/q)(1/\sqrt{2})(1+j), n \text{ is a member of the set } \{1,2,3, \ldots, q\} \quad (4)$$

to have q pairs $(v_n, w_n)$, where $$w_n = B(v_n) \quad (5)$$

Then, from the inverse function relationship described in equation (3), function $A(.)$ must satisfy the following relations.

$$v_n = A(w_n), n \text{ is a member of the set } \{1,2,3, \ldots, q\} \quad (6)$$

By defining a size q complex vector v as $[v_1, v_2, v_3, \ldots, q]$, equation (6) can be expressed in term of complex matrices $$v^t = D a^t \quad (7)$$

where $$D \equiv \begin{bmatrix} w_1 & |w_1|w_1 & |w_1|^2 w_1 & \ldots & |w_1|^{q-1} w_1 \\ w_2 & |w_2|w_2 & |w_2|^2 w_2 & \ldots & |w_2|^{q-1} w_2 \\ \vdots & \vdots & \vdots & \vdots & \vdots \\ w_q & |w_q|w_q & |w_q|^2 w_q & \ldots & |w_q|^{q-1} w_q \end{bmatrix}$$

For the representation of the equation (7) in terms of real matrices, $$\Re[v^t] + j\Im[v^t] = (\Re[D] + j\Im[D]) \cdot (\Re[a^t] + j\Im[a^t]) \quad (8)$$

Then, $$\Re[v^t] = \Re[D] \cdot \Re[a^t] - \Im[D] \cdot \Im[a^t] \Im[v^t] = \Im[D] \cdot \Re[a^t] + \Re[D] \cdot \Im[a^t] \quad (9)$$

Thus, $$\begin{bmatrix} \Re[v^t] \\ \Im[v^t] \end{bmatrix} = \begin{bmatrix} \Re[D] & -\Im[D] \\ \Im[D] & \Re[D] \end{bmatrix} \cdot \begin{bmatrix} \Re[a^t] \\ \Im[a^t] \end{bmatrix} \quad (10)$$

Finally, the complex coefficients of the predistortion function $A(.)$ can be found.

$$\begin{bmatrix} \Re[a^t] \\ \Im[a^t] \end{bmatrix} = \begin{bmatrix} \Re[D] & -\Im[D] \\ \Im[D] & \Re[D] \end{bmatrix}^{-1} \cdot \begin{bmatrix} \Re[v^t] \\ \Im[v^t] \end{bmatrix} \quad (11)$$

It was determined that predistortion performance was better with larger order q, noting, however, that a matrix inversion for a size 2q×2q matrix is necessary as illustrated in equation (11). By dividing the input range R at q points, the number of terms required to determine the inverse is kept at a minimum. Theoretically, the number of terms in the inverse is infinite. In practice, tenth-order terms may be required to sufficiently describe a whole range. By setting q to three points, the input range R can be described with fifth-order terms. Avoiding high order terms mitigates the error introduced by rounding and provides a closer polynomial fit for a more accurate predistortion function, thereby enabling more linear amplification. Additional advantage can be found in the increase in execution speed as well as the reduction in hardware.

The above approach can be further extended by sectorizing the input range R into several pieces and by then obtaining predistortion polynomials for each sector. Comparing the multiple sector approach with the single sector approach discussed above, better performance was achieved with the same order polynomial or alternatively, it was possible to use smaller order polynomials to achieve the same performance.

The multiple sector approach is now discussed in more detail. Let the number of sectors be K, then divide the input range R into K pieces as $[\mathbf{0}, R_1], [R_1, R_2], \ldots, [R_{K-1}, R_K]$, where $R_K = R$. Predistortion polynomials $A_k(\bullet)$, k is a member of the set $\{1, 2, \ldots, K\}$ are obtained for each sector. Let $a_k = [a_{k1}, a_{2k}, a_{k3}, \ldots, a_{kqsubk}]$ be the vector of complex coefficients for $q_k$-th order polynomial $A_k(\bullet)$. As before, the goal is to obtain the best $a_k$.

As above, the input range $[R_{k-j}, R_k]$ is uniformly divided at $q_k$ points as:

$$v_{kn} = n(R_k / q_k)(1/\sqrt{2})(1+j), \text{ if } k = 1 \quad (12)$$
$$= R_{k-1} + (n-1)((R_k - R_{k-1})/q_k - 1)(1/\sqrt{2})(1+j), \text{ otherwise}$$

to have $q_k$ pairs $(v_{kn}, w_{kn})$, where $$w_{kn} = B(v_{kn}), n \text{ is a member of the set } \{1,2,3, \ldots, q_k\} \quad (13)$$

Then, function $A_k(\bullet)$ must satisfy the following relations:

$$v_{kn} = A_k(w_{kn}) \quad (14)$$

If a size $q_k$ complex vector $v_k$ is defined as $[v_{k1}, v_{k2}, v_{k3}, \ldots, v_{kqsubk}]$, then equation (14) can be expressed in terms of complex matrices as follows:

$$v_k^t = D_k \cdot a_k^t \quad (15)$$

where $$D_k \equiv \begin{bmatrix} w_{k1} & |w_{k1}|w_{k1} & |w_{k1}|^2 w_{k1} & \ldots & |w_{k1}|^{q_k-1} w_{k1} \\ w_{k2} & |w_{k2}|w_{k2} & |w_{k2}|^2 w_{k2} & \ldots & |w_{k2}|^{q_k-1} w_{k2} \\ \vdots & \vdots & \vdots & \vdots & \vdots \\ w_{kq_k} & |w_{kq_k}|w_{kq_k} & |w_{kq_k}|^2 w_{kq_k} & \ldots & |w_{kq_k}|^{q_k-1} w_{kq_k} \end{bmatrix} \quad (10)$$

By using the procedure described in equations (8), (9), (10) and (11), the complex coefficients of the $q_k$-th order predistortion function $A_k(\bullet)$ can be obtained for the k-th sector:

$$\begin{bmatrix} \Re[a_k^t] \\ \Im[a_k^t] \end{bmatrix} = \begin{bmatrix} \Re[D_k] & -\Im[D_k] \\ \Im[D_k] & \Re[D_k] \end{bmatrix}^{-1} \cdot \begin{bmatrix} \Re[v_k^t] \\ \Im[v_k^t] \end{bmatrix} \quad (16)$$

Thus, a predistortion module generates a predistorted signal in response to an input signal and predistortion coefficients. The predistortion function calculating module generates the predistortion coefficients in response to given amplifier characteristics. Polynomial fitting is used to obtain the predistortion coefficients. For example, rather than analytically calculating the inverse to an amplifier characteristic curve, a number of points along the amplifier characteristic curve are used to determine a predistortion function having a corresponding order. In certain embodiments, the x- and y-axis terms of the amplifier characteristics curve are switched to produce points along a predistortion curve. The predistortion function calculating module calculates a polynomial function which connects the points. Thus, the predistortion function can be more easily calculated.

Figure 4:
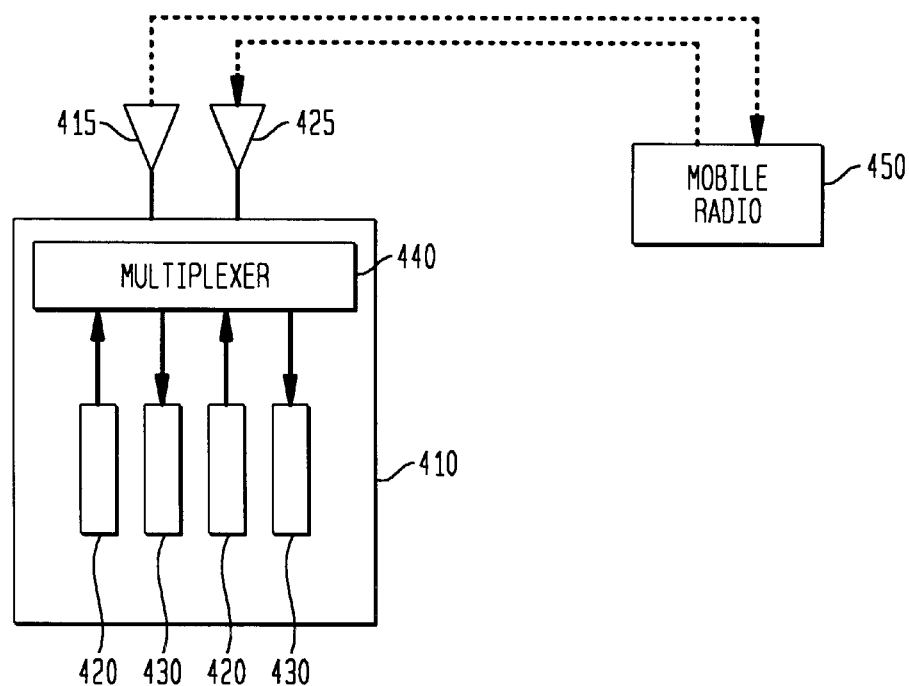
FIG. 4 is a block diagram illustrating the power amplifier of FIG. 3 as used in a RF transmission system in accordance with the principles of the present invention.

FIG. 4 illustrates a base station 410 with power amplifiers employing a predistortion linearization technique in accordance with the principles of the present invention.

As shown in FIG. 4, base station 410 comprises a pair of transmitters 420 each having a power amplifier as shown in FIG. 3. Base station 410 can comprise, if necessary, a single transmitter or additional transmitters. In addition, base station 410 includes a suitable transmit antenna 415 for transmission in a RF transmission system that comprises both wireless and wired equipment. Base station 410 can utilize any equipment suitable for sending and receiving RF transmissions, such as those employing Code Division Multiple Access (CDMA) communications. In FIG. 4, a mobile radio 450 is shown as well as the base station 410 including a receive antenna 425, a pair of receivers 430 and a multiplexer 440. Additional mobile radios may be serviced by the base station 410, and it will be apparent to one of ordinary skill that base station 410 can be used for providing wireless communications in any desired manner and for any type of wireless communications protocol or standard.

Numerous modifications and alternative embodiments of the invention will be apparent to those skilled in the art in view of the foregoing description. Accordingly, this description is to be construed as illustrative only and is for the purpose of teaching those skilled in the art the best mode of carrying out the invention. Details of the structure may be varied substantially without departing from the spirit of the invention and the exclusive use of all modifications that come within the scope of the appended claim is reserved.

What is claimed is:

1. An apparatus for calculating a predistortion function from power amplifier characteristics, said apparatus comprising:

a predistortion module responsive to predistortion coefficients and an input signal by generating a predistorted signal, said predistortion coefficients being of a complex polynomial of order q (q is an integer greater than one);

an amplifier responsive to said predistorted signal by generating an output signal; and a predistortion function calculating module responsive to said amplifier characteristics by generating said predistortion coefficients, said predistortion function calculating module having a polynomial fitting module, said polynomial fitting module including, means for uniformly dividing said signal range at q points; and means for calculating said predistortion coefficients, wherein said predistortion coefficients are represented by the equation:

$$\begin{bmatrix} R[a^t] \\ I[a^t] \end{bmatrix} = \begin{bmatrix} R[D] & -I[D] \\ I[D] & R[D] \end{bmatrix}^{-1} \cdot \begin{bmatrix} R[v^t] \\ I[v^t] \end{bmatrix}$$

wherein $a^t$ is a transpose of a size q vector of said predistortion coefficients, wherein $v^t$ is a transpose of a size q vector of said uniformly divided signal range, and wherein D is a q×q matrix representation of said output signal.

2. An apparatus for calculating a predistortion function from power amplifier characteristics, said apparatus comprising:

a predistortion module responsive to predistortion coefficients and an input signal by generating a predistorted signal, said predistortion coefficients being of a complex polynomial of order q (q is an integer greater than one);

an amplifier responsive to said predistorted signal by generating an output signal; and a predistortion function calculating module responsive to said amplifier characteristics by generating said predistortion coefficients, said predistortion function calculating module having a polynomial fitting module, said polynomial fitting module including, means for uniformly dividing said signal range at q points;

means for calculating said predistortion coefficients;

means for dividing a signal range of said predistorted signal into a given number of sectors;

means for uniformly dividing each of said sectors at a given number of points; and means for calculating said predistortion coefficients for each of said sectors.

3. A wireless radio frequency communications system including apparatus for calculating a predistortion function from power amplifier characteristics, said system comprising:

a predistortion module responsive to predistortion coefficients and an input signal by generating a predistorted signal, said predistortion coefficients being of a complex polynomial of order q (q is an integer greater than one);

an amplifier responsive to said predistorted signal by generating an output signal; and a predistortion function calculating module responsive to said amplifier characteristics by generating said predistortion coefficients, said predistortion function calculating module having a polynomial fitting module, said polynomial fitting module including, means for uniformly dividing said signal range at q points; and means for calculating said predistortion coefficients, wherein said predistortion coefficients are represented by the equation:

$$\begin{bmatrix} R[a^t] \\ I[a^t] \end{bmatrix} = \begin{bmatrix} R[D] & -I[D] \\ I[D] & R[D] \end{bmatrix}^{-1} \cdot \begin{bmatrix} R[v^t] \\ I[v^t] \end{bmatrix}$$

wherein $a^t$ is a transpose of a size q vector of said predistortion coefficients, wherein $v^t$ is a transpose of a size q vector of said uniformly divided signal range, and wherein D is a q×q matrix representation of said output signal.

4. A wireless radio frequency communications system including apparatus for calculating a predistortion function from power amplifier characteristics, said system comprising:

a predistortion module responsive to predistortion coefficients and an input signal by generating a predistorted signal, said predistortion coefficients being of a complex polynomial of order q (q is an integer greater than one);

an amplifier responsive to said predistorted signal by generating an output signal; and a predistortion function calculating module responsive to said amplifier characteristics by generating said predistortion coefficients, said predistortion function calculating module having a polynomial fitting module, said polynomial fitting module including, means for uniformly dividing said signal range at q points;

means for calculating said predistortion coefficients;

means for dividing a signal range of said predistorted signal into a given number of sectors;

means for uniformly dividing each of said vectors at a given number of points; and means for calculating said predistortion coefficients for each of said sectors.

5. A method for calculating a predistortion function from power amplifier characteristics, comprising the steps of:

generating a predistorted signal in response to predistortion coefficients and an input signal, said predistortion coefficients being of a complex polynomial of order q (q is an integer greater than one);

amplifying said predistorted signal to generate an output signal; and generating predistortion coefficients in response to said amplifier characteristics by generating said predistortion coefficients using polynomial fitting, said step of generating said predistortion coefficients further including the steps of, uniformly dividing said signal at range q points; and calculating said predistortion coefficients, wherein said predistortion coefficients are represented by the equation:

$$\begin{bmatrix} R[a^t] \\ I[a^t] \end{bmatrix} = \begin{bmatrix} R[D] & -I[D] \\ I[D] & R[D] \end{bmatrix}^{-1} \cdot \begin{bmatrix} R[v^t] \\ I[v^t] \end{bmatrix}$$

wherein $a^t$ is a transpose of a size q vector of said predistortion coefficients, wherein $v^t$ is a transpose of a size q vector of said uniformly divided signal range, and wherein D is a q×q matrix representation of said output signal.

6. A method for calculating a predistortion function from power amplifier characteristics, comprising the steps of:

generating a predistorted signal in response to predistortion coefficients and an input signal, said predistortion coefficients being of a complex polynomial of order q (q is an integer greater than one);

amplifying said predistorted signal to generate an output signal; and generating predistortion coefficients in response to said amplifier characteristics by generating said predistortion coefficients using polynomial fitting, said step of generating said predistortion coefficients further including the steps of, uniformly dividing said signal at range q points;

calculating said predistortion coefficients;

dividing a signal range of said predistorted signal into a given number of sectors;

uniformly dividing each of said sectors at a given number of points; and calculating said predistortion coefficients for each of said sectors.

7. An apparatus for calculating a predistortion function from power amplifier characteristics, said apparatus comprising:

a first module that utilizes q points of information from a curve of said amplifier characteristics to obtain predistortion coefficients of a complex polynomial of order q (q is an integer greater than one); and a second module responsive to said first module by generating a complex polynomial function based on said predistortion coefficients, wherein said first module utilizes q points of information from a predistortion function curve to obtain said predistortion coefficients, said predistortion function curve obtained by switching axes of said amplifier characteristics curve.

* * * * *